(12) United States Patent
Lai et al.

(10) Patent No.: US 11,302,664 B2
(45) Date of Patent: *Apr. 12, 2022

(54) METHOD OF MANUFACTURING DIE PACKAGE STRUCTURE

(71) Applicant: Comchip Technology Co., Ltd., New Taipei (TW)

(72) Inventors: Chien-Chih Lai, New Taipei (TW); Hung-Wen Lin, New Taipei (TW)

(73) Assignee: Comchip Technology Co., Ltd., New Taipei (TW)

( * ) Notice: Subject to any disclaimer, the term of this patent is extended or adjusted under 35 U.S.C. 154(b) by 107 days.

This patent is subject to a terminal disclaimer.

(21) Appl. No.: 16/888,844

(22) Filed: May 31, 2020

(65) Prior Publication Data

US 2021/0343672 A1 Nov. 4, 2021

(30) Foreign Application Priority Data

Apr. 29, 2020 (TW) .................................. 109114389

(51) Int. Cl.
*H01L 23/00* (2006.01)
*H01L 21/56* (2006.01)

(52) U.S. Cl.
CPC .............. *H01L 24/19* (2013.01); *H01L 21/56* (2013.01); *H01L 24/96* (2013.01); *H01L 2924/01028* (2013.01); *H01L 2924/01029* (2013.01); *H01L 2924/01079* (2013.01)

(58) Field of Classification Search
CPC ................................ H01L 24/19; H01L 24/96
See application file for complete search history.

(56) References Cited

U.S. PATENT DOCUMENTS

2006/0087010 A1* 4/2006 Hong ................ H01L 23/49838
257/676

* cited by examiner

*Primary Examiner* — Yu-Hsi D Sun
(74) *Attorney, Agent, or Firm* — CKC & Partners Co., LLC

(57) ABSTRACT

A method of manufacturing a die package structure includes steps described below. A conductive substrate with a plurality of trenches is provided. A die is disposed in each of the trenches. A conductive layer is formed covering the dies and the conductive substrate. A patterned photoresist layer with a plurality of openings is formed exposing a plurality of areas of the conductive layer. A mask is formed on each of the areas of the conductive layer. The patterned photoresist layer is removed after forming the masks. By using the masks, the conductive layer and the conductive substrate under thereof are selectively etched to a predetermined depth to form a plurality of conductive bumps and a plurality of electrodes, in which a remaining of the conductive substrate includes a bottom substrate, the electrodes and the conductive bumps. An upper sealing layer is formed covering the bottom substrate and the dies.

10 Claims, 10 Drawing Sheets

METHOD OF MANUFACTURING DIE PACKAGE STRUCTURE

CROSS-REFERENCE TO RELATED APPLICATION

This application claims priority to Taiwan Application Serial Number 109114389, filed on Apr. 29, 2020, which is herein incorporated by reference.

BACKGROUND

Field of Invention

The present disclosure relates to a method of manufacturing die package structure, particularly relates to a method of manufacturing embedded die package structure package structure.

Description of Related Art

When consumer electronics goods such as mobile phones, tablets, laptops are widely used, the demands for electronic products made with high functionality and small size has risen. Die packaging is one of crucial steps in forming electronic products. Decreasing the size of a die package and further improving the performance of the die package have now become important topics.

It's time-consuming to perform conventional packaging process which includes processes of die bonding, wire bonding and molding for the dies that cut one by one from a wafer. In addition, wire bonding is used in the conventional process to provide electrical connection for the power chip in the power module but resulting in difficulties of heat dissipation of the power chip.

In view of above, one of the objectives of the present invention is providing a method of manufacturing die package structure to solve the mentioned problems.

SUMMARY

A method of manufacturing a die package structure includes steps described below. A conductive substrate with a plurality of trenches is provided. A die is disposed in each of the trenches. A conductive layer is formed covering the dies and the conductive substrate. A patterned photoresist layer with a plurality of openings is formed exposing a plurality of areas of the conductive layer. A mask is formed on each of the areas of the conductive layer, in which each of the masks comprises a copper layer and a metal layer on the copper layer. The patterned photoresist layer is removed after forming the masks. By using the masks, the conductive layer and the conductive substrate under thereof are selectively etched to a predetermined depth to form a plurality of conductive bumps and a plurality of electrodes, in which a remaining of the conductive substrate includes a bottom substrate, the electrodes and the conductive bumps. The electrodes are located on the bottom substrate and the conductive bumps are located on the dies. An upper sealing layer is formed covering the bottom substrate and the dies, in which each of the metal layers of the masks or each of the copper layers of the masks is exposed from the upper sealing layer.

In some embodiments, the conductive substrate is substantially made of copper.

In some embodiments, the conductive substrate has a first thickness and each of the trenches has a depth, the depth is in a range of 45%-55% of the first thickness.

In some embodiments, each of the metal layers includes a nickel layer and a gold layer on the nickel layer.

In some embodiments, the method further includes thinning the bottom substrate to form a thinned bottom substrate after forming the upper sealing layer, and patterning the thinned bottom substrate thereby forming a wiring layer.

In some embodiments, the method further includes forming a lower sealing layer covering the wiring layer after forming the wiring layer, and cutting the upper sealing layer and the lower sealing layer to obtain a plurality of package structures separating from each other.

In some embodiments, a thickness of each the package structures is ranged from about 130 μm to about 200 μm.

In some embodiments, forming the conductive layer includes forming a copper seed layer by using electroless plating and forming a copper plating layer on the copper seed layer by using electroplating.

In some embodiments, forming the upper sealing layer covering the bottom substrate and the dies includes forming a sealing material layer covering the bottom substrate, the dies, the masks, the electrodes and the conductive bumps, and thinning the sealing material layer thereby exposing each of the metal layers from the thinned sealing material layer.

In some embodiments, forming the upper sealing layer covering the bottom substrate and the dies includes forming a sealing material layer covering the bottom substrate, the dies, the masks, the electrodes and the conductive bumps, and thinning the sealing material layer, in which each of the metal layers of the masks is removed and each of the copper layers of the masks is exposed from the thinned sealing material layer, and a metal pad is formed on each of the copper layers.

The above descriptions will be described in detail in the following embodiments, and further explanation will be provided for the technical solution of the present invention.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
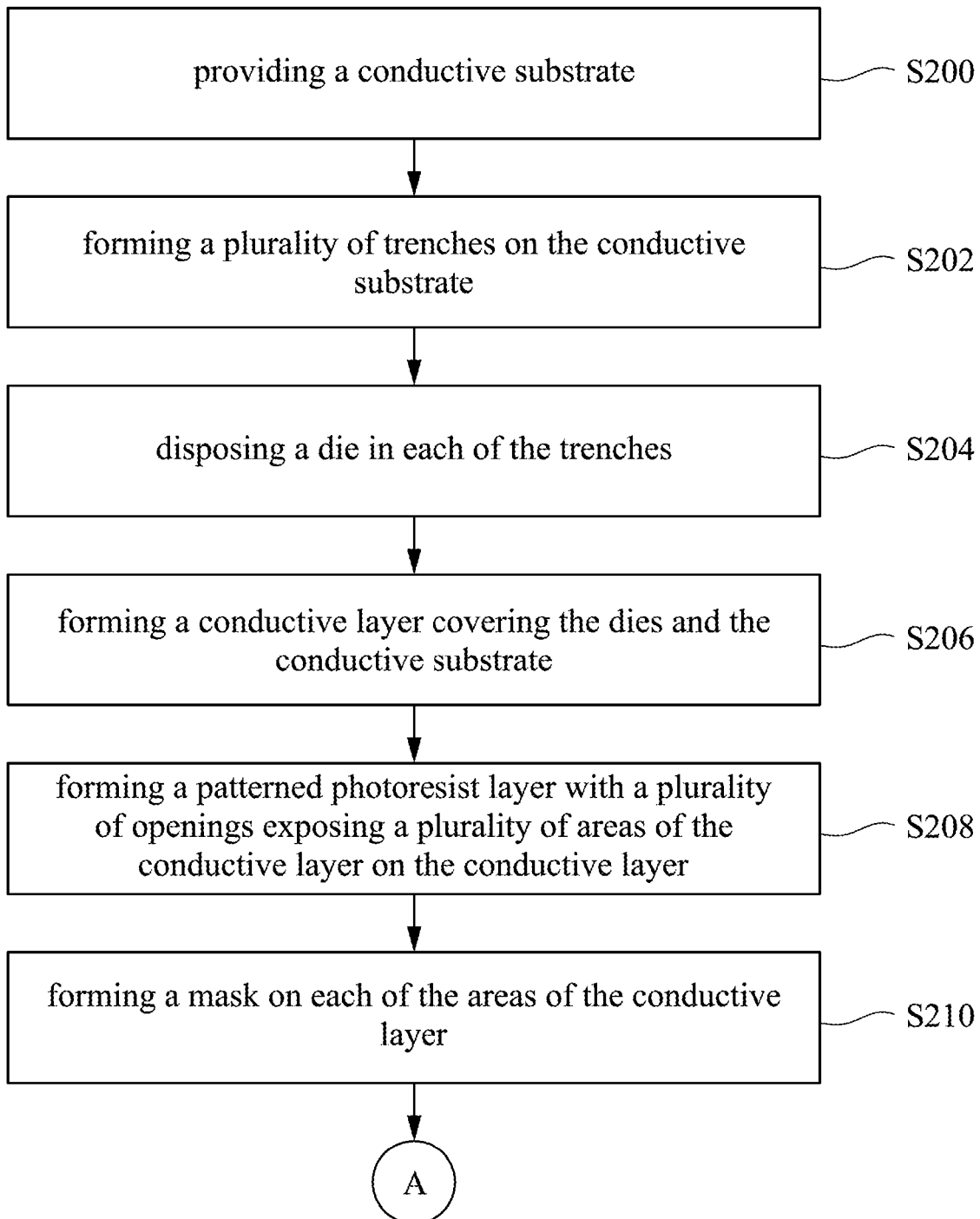
FIG. 1A and FIG. 1B are flowcharts illustrating method of manufacturing die package structure according to one embodiment of the present invention.

In order to make the description of the embodiments of the present invention more comprehensive and complete, an illustrative description is provided for the implementation aspects and specific embodiments of the present invention; rather than the only form of implementing or using the specific embodiments of the present invention. The embodiments disclosed below can be combined or replaced with each other under the beneficial facts, and other embodiments can be added to one embodiment without further description or description.

In the following description, a number of specific details will be described in detail to enable the reader to fully understand the following embodiments. However, the embodiments of the disclosure may be practiced without these specific details. In other cases, in order to simplify the drawings, obvious structures and devices are only shown residually in the drawings.

In the embodiments and the scope of the patent application, unless there is a special limitation on the article in the text, "a" and "the" can refer to a single or plural. Regarding the "about" used in this text, the terms "about" or "approximately" generally have an error or range of the index value within about 20%, more preferably within about 10%, more preferably It is within about five percent.

Figure 1B:
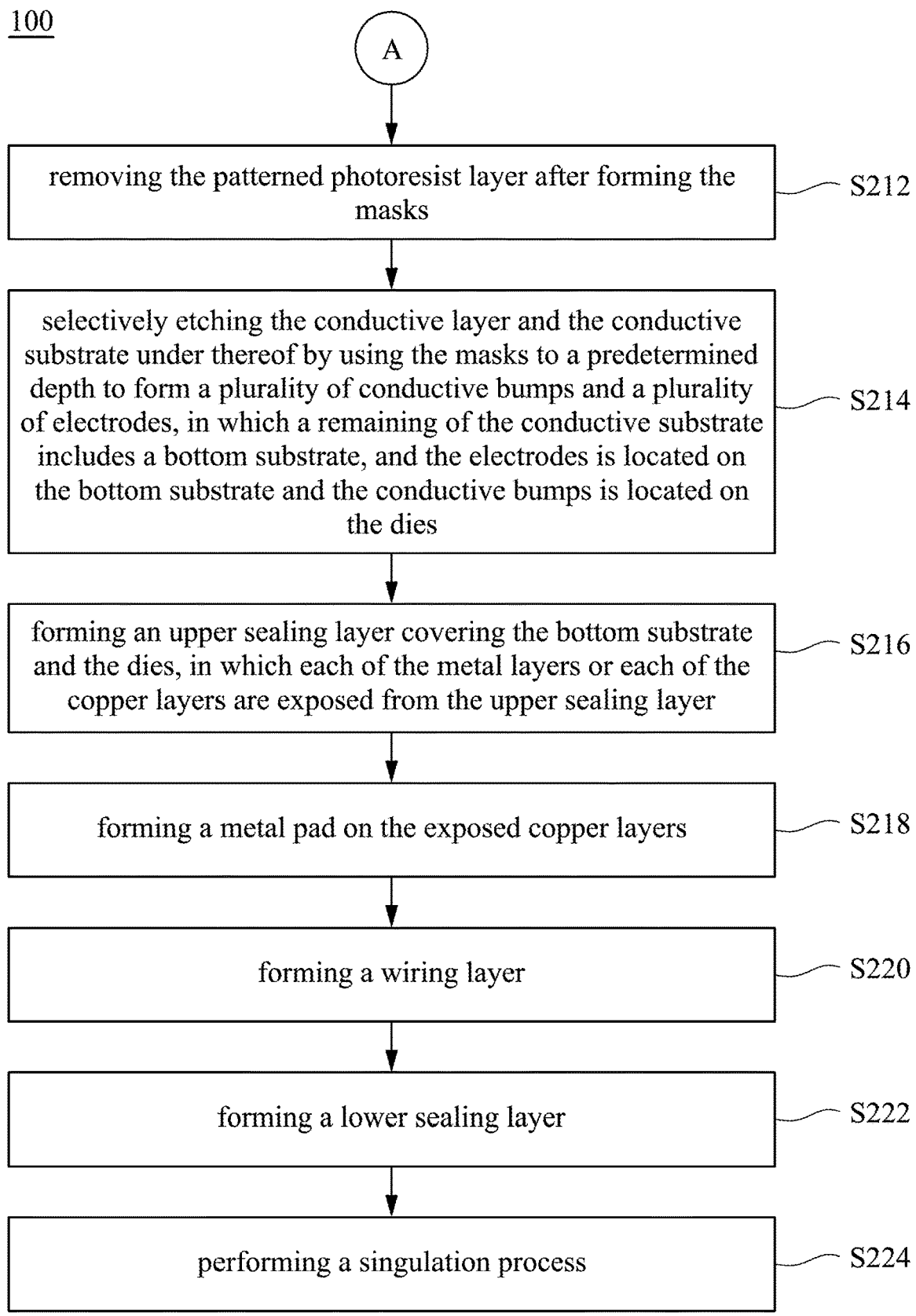

One aspect of the present invention is providing a method of manufacturing embedded die package structure. By using this method, the conventional methods can be simplified and the heat dissipation problems of package can be reduced. FIG. 1A and FIG. 1B are flowcharts illustrating method 100 of manufacturing die package structure according to one embodiment of the present invention. FIGS. 2-14 are cross-section views illustrating each stage of method 100 of manufacturing die package structure according to one embodiment of the present invention. The method 100 includes step S200, step S202, step S204, step S206, step S208, step S210, step S212, step S214, step S216, step S218, step S220, step S222, and step S224.

Figure 2:
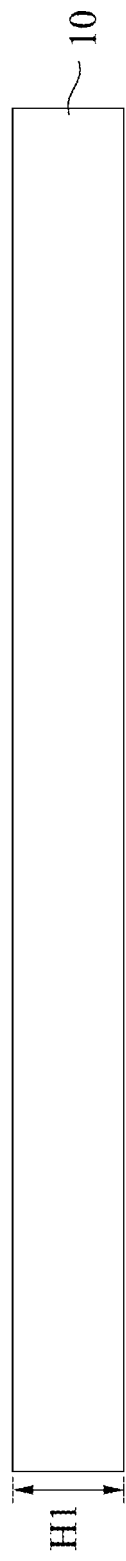
FIGS. 2-14 are cross-section views illustrating each stage of method of manufacturing die package structure according to one embodiment of the present invention.

Referring to step S200, a conductive Substrate 10 is provided or received as shown in FIG. 2. The conductive substrate 10 is made of conductive materials, for example, metal, graphene, or semiconductor material, etc. In some embodiments, the conductive substrate 10 is substantially made of copper. In some embodiments, a thickness H1 of the conductive substrate 10 is about twice of the thickness of a die to be processed in packaging (shown in FIG. 4). In examples, the thickness of the die is about 100 μm and the thickness of the conductive substrate is about 200 μm.

Figure 3:
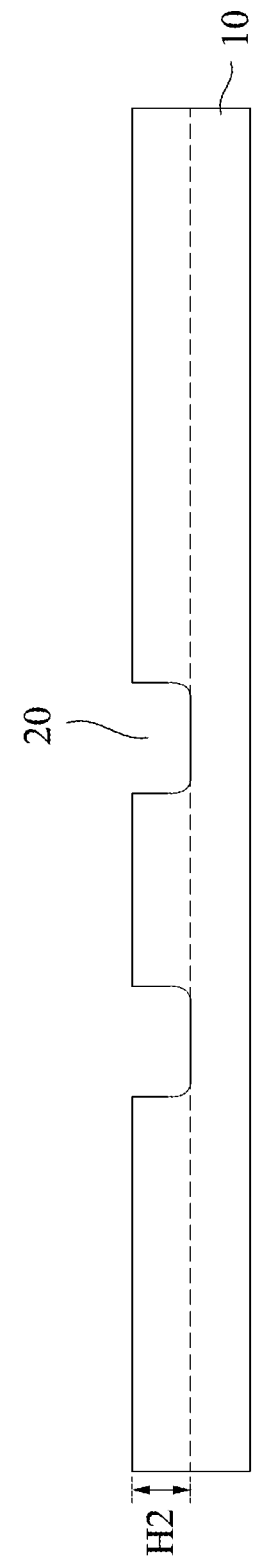

Referring to step S202, a plurality of trenches 20 are formed on the conductive substrate 10 as shown in FIG. 3. For example, a photoresist layer is formed on the conductive substrate 10, and then multiple openings are formed on the photoresist layer by using photolithography processes. Thereafter, the openings are transferred to the conductive substrate 10 by using etching processes to form trenches 20 each having depth H2. In some embodiments, the depth H2 is in a range of 45%-55% of the thickness H1, such as 50%. In some embodiments, the etching process includes dry or wet etching. In some embodiments, the photoresist layer is a dry film resist (DFR).

Figure 4:
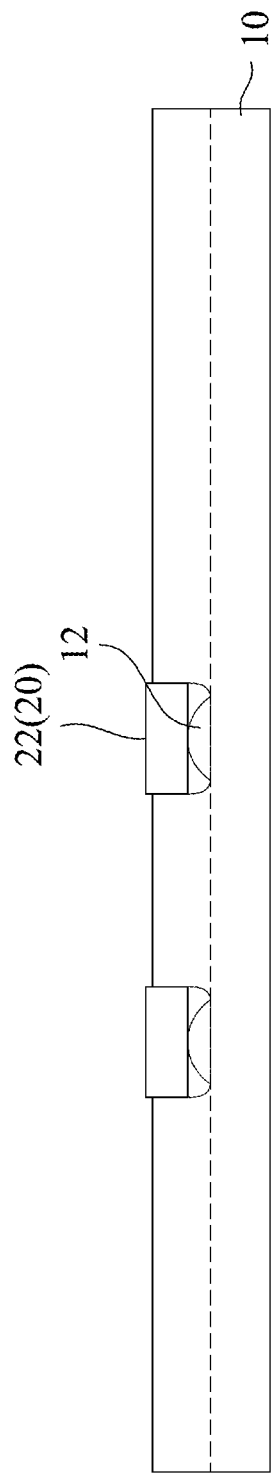

Referring to step S204, a die 22 is disposed in each of trenches 20 as shown in FIG. 4. The die 22 includes, but are not limited to, dynamic random access memory (DRAM) devices, flash memory devices, static random access memory (SRAM) device, passive device, radio frequency module device, other suitable devices, or the combinations of thereof.

In some embodiments, die 22 is set in the trench 20 by using die bonding process. Specifically, adhesive glue 12 is firstly placed inside each of the trenches 20 of the conductive substrate 10. Subsequently, dies 22 is disposed in each of the trenches 20. Each die 22 is attached respectively at bottom of each the trenches 20 by adhesive glue 12. The sidewalls of each die 22 substantially or partially touch the sidewalls of the trench 20. A top surface of each die 22 is substantially lower, higher or at same level to the top surface of the conductive substrate 10. Thereafter, optionally the conductive substrate 10 is heated to accelerate the adhesion reaction of the adhesive glue 12. In some embodiments, one die 22 is disposed in each trench 20. In some embodiments, each die 22 is formed with single chip. In another embodiment, each die 22 is formed with dual chips. In some embodiments, a length and a width of the trench 20 are about 0.1×0.16 mm².

Figure 5:
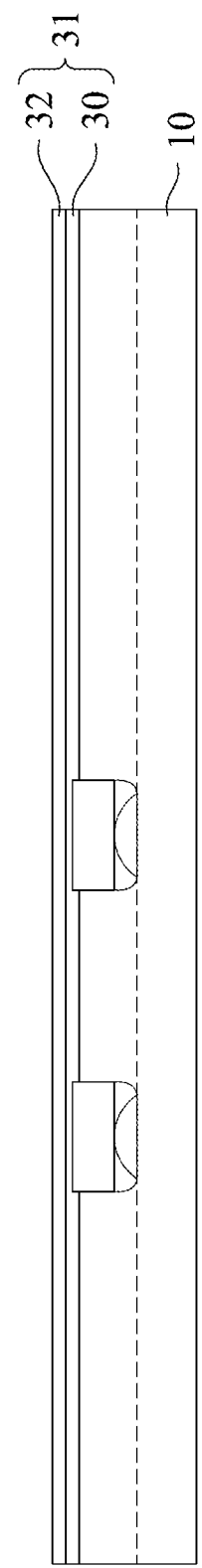

Referring to step S206, a conductive layer 31 is formed on the conductive substrate 10 as shown in FIG. 5. In some embodiments, the conductive layer 31 includes a copper seed layer 30 and a copper plating layer 32 on the copper seed layer 30. Specifically, the copper plating layer 32 is formed on the copper seed layer 30 after the copper seed layer 30 is formed to cover die 22 and the conductive substrate 10. In examples, the copper seed layer 30 is formed on the conductive substrate 10 by using electroless copper plating; thereafter the copper plating layer 32 is formed on the copper seed layer 30 by using electroplating. In some embodiments, a thickness of the copper seed layer is ranged from about 10 μm to 100 μm. In some embodiments, a thickness of the copper plating layer is ranged from about 10 μm to 100 μm.

Continually referring to FIG. 5, optionally a planarization process is performed on the conductive layer 31 after forming the conductive layer 31 as such the conductive layer 31 has a substantial planar surface. In some embodiments, the planarization process includes grinding process, chemical mechanical polish, one or more applicable processes or the combinations of thereof.

Figure 6A:
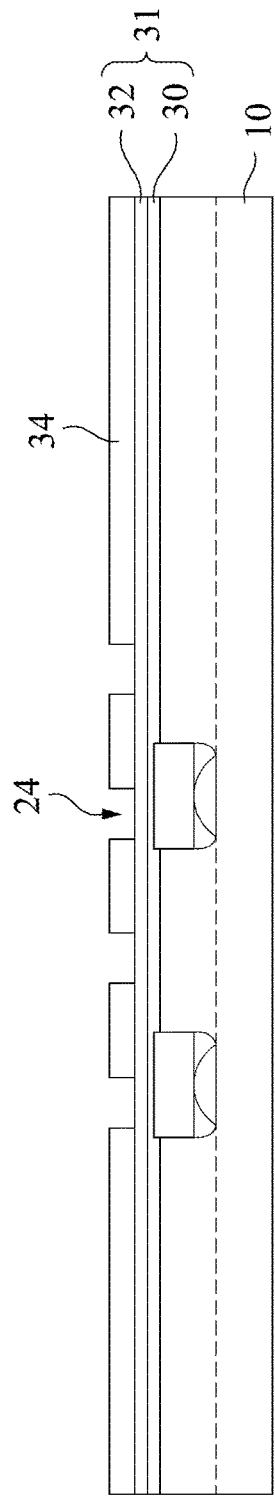

Referring to step S208, a patterned photoresist layer 34 is formed on the conductive layer 31 as shown in FIG. 6A. A plurality of openings of the patterned photoresist layer are exposing a plurality of areas 24 of the conductive layer 31. In some embodiments, the photoresist layer 34 is a dry film resist (DFR).

Figure 6B:
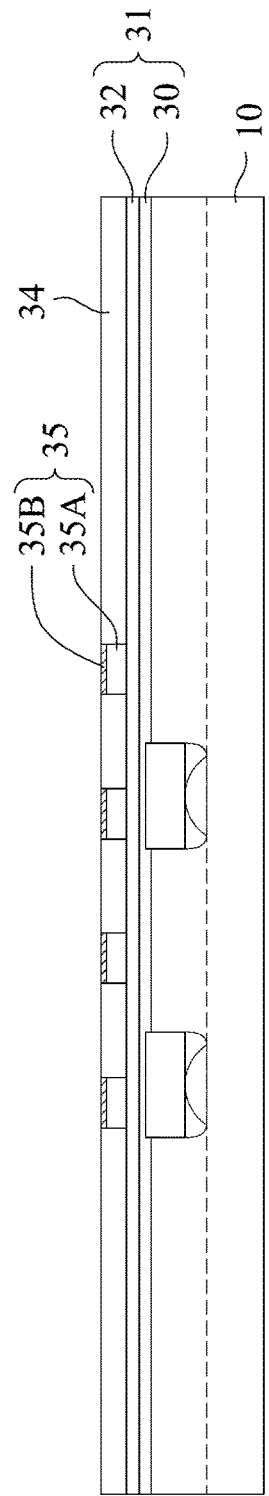

Followed by step S210 and referring to FIG. 6B, a mask 35 is formed on each of the areas 24 of the photoresist layer 34. The mask 35 is used as an etching resistant material layer in the following steps. In some embodiments, each of the masks 35 includes a copper layer 35A and a metal layer 35B on the copper layer 35A. In some embodiments, each of the metal layers 35B includes a nickel layer and a gold layer on the nickel layer (not shown for simplicity). The copper layer 35A or metal layer 35B is formed by using electroplating process, electroless plating process, other suitable methods or the combinations of thereof. In some embodiments, metal layer 35B is made of materials showing etch selectivity to copper. In some embodiments, metal layer 35B is made of solderable materials.

Figure 6C:
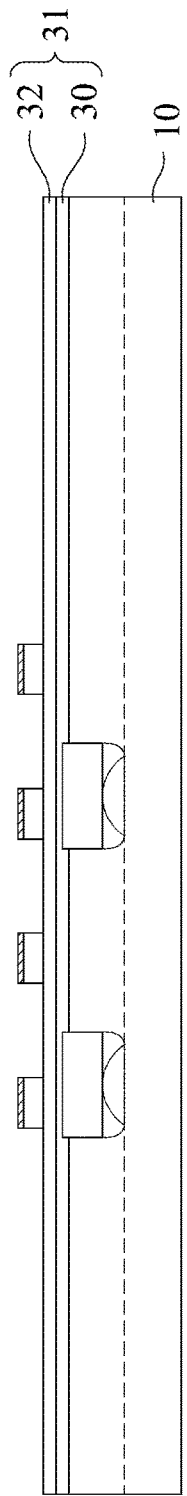

Followed by step S212 and referring to FIG. 6C, after forming the mask 35, the photoresist layer 34 is removed thereby leaving the masks 35 covering each of areas 24. In some embodiments, a photoresist stripping solution or an ashing process is applied herein to remove the photoresist layer 34.

Figure 7:
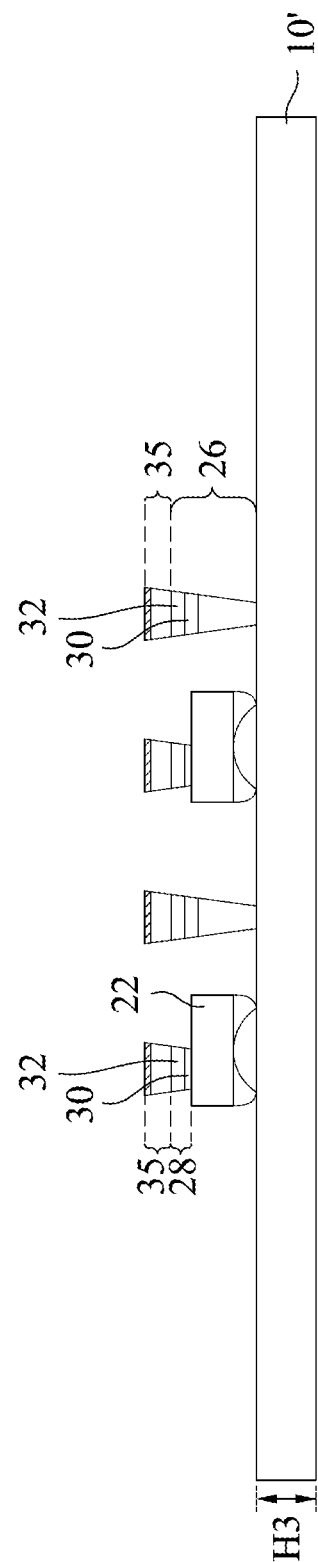

Referring to step S214, as shown in FIG. 7, the mask 35 is used as the etching resistant material layer, the conductive layer 31 and the conductive substrate 10 under thereof are selectively etched to a predetermined depth to form a plurality of conductive bumps 28 and a plurality of electrodes 26. A remaining of the conductive substrate includes a bottom substrate 10'. The electrodes 26 are located on the bottom substrate 10' and the conductive bumps 28 are located on the dies 22. In some embodiments, the conductive layer 31 and the conductive substrate 10 are etched by using wet etch processes. In some embodiments, the predetermined depth is substantially equal to the depth of each trench 20. In some embodiments, a thickness H3 of the bottom substrate 10' is sustainably equal or thicker than the thickness of the die 22.

Figure 8A:
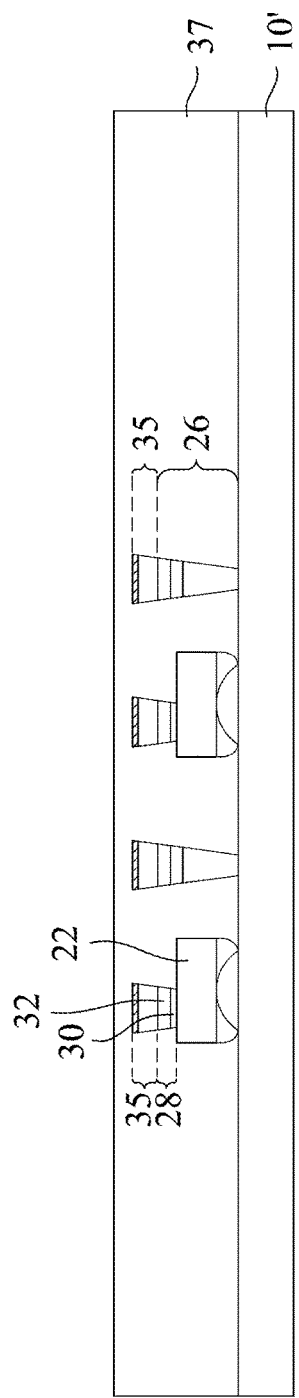
Figure 8B:
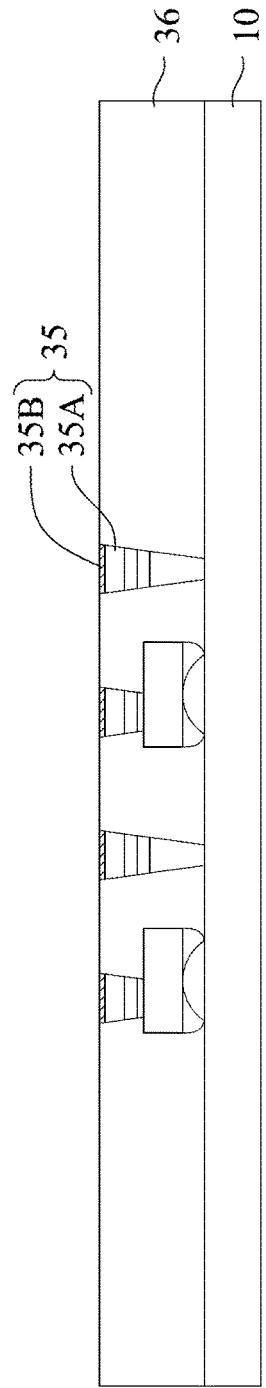
Figure 8C:
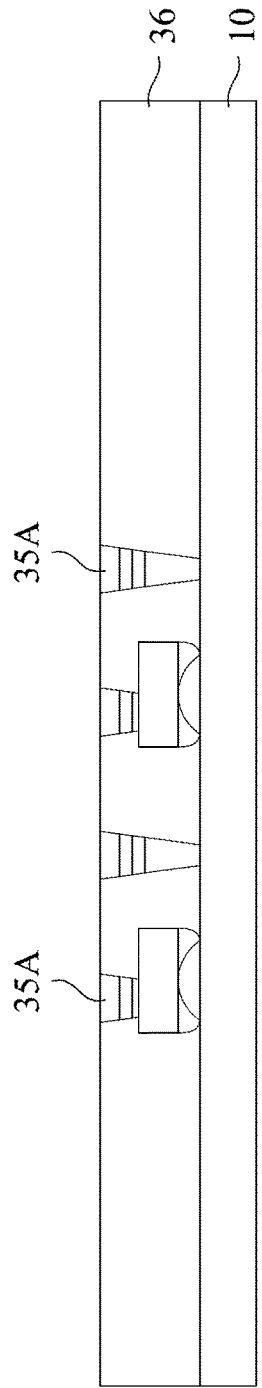

Followed by step S216 and referring to FIGS. 8A and 8C, a sealing material layer 37 is formed covering the bottom substrate 10', the dies 22, the masks 35, the electrodes 26 and the conductive bumps 28 as shown in FIG. 8A. Thereafter, a thinning process, such as polishing, is performed on the sealing material layer 37 and an upper sealing layer 36 is formed where each of the metal layers 35B of the masks 35 or each of the copper layers 35A of the masks 35 is exposed from the upper sealing layer 36 as shown in FIG. 8B and FIG. 8C. Specifically, after performing thinning process to the sealing material layer 37, each of the metal layers 35B of the masks is exposed from the thinned sealing material layer 36. In one embodiment of the present disclosure, each of the metal layers 35B of the masks is not removed but being exposed from the thinned sealing material layer 36 after performing thinning process as shown in FIG. 8B. In the other embodiment of the present disclosure, each of the metal layers 35B of the masks 35 is removed and each of the copper layers 35A of the masks 35 is exposed from the upper sealing layer 36 after performing thinning process as shown in FIG. 8C.

In some embodiments, the method of forming sealing material layer 37 includes injecting process, spin coating process, dispensing process, film lamination process, coating process, or the combinations of thereof. In some embodiments, thermal curing processes are applied in the formation of the sealing layer material 37.

Referring again to step S216, during the process of thinning the sealing material layer 37, the metal layers 35B of the masks 35 are not removed (as shown in FIG. 8B) or removed (as shown in FIG. 8C) by controlling the thinning process. If the metal layers 35B of the masks 35 are not removed, the metal layers 35B of the masks 35 on each of the electrodes 26 and on each of the conductive bumps 28 can be directly used as metal pads which provide electrical connections between packages 300 and external circuits.

It is noted that the mask 35 of the present invention is providing at least two functions. One function is that the mask 35 is used as an etching resistant material layer for selectively etching conductive layer 31 and the conductive substrate 10 as mentioned in step S214. The other function is that, after forming the upper sealing layer 36 as mentioned in step S216, the exposed metal layers 35B of the masks 35 can be directly used as metal pads 40 (shown in FIG. 9) to provide electrical connections between packages 300 and external circuits. Moreover, during process of step S208, one of the known practices is applying a first photomask for patterning the patterned photoresist layer 34 that is used as an etching resistant material layer for selectively etching the conductive layer 31 and the conductive substrate 10. However, by using this know practice, it would require a second photomask for forming metal pads 40. From the above, the present invention providing a method in which the manufacturing process of die package structure is simplified and the cost of production is reduced.

Figure 9:
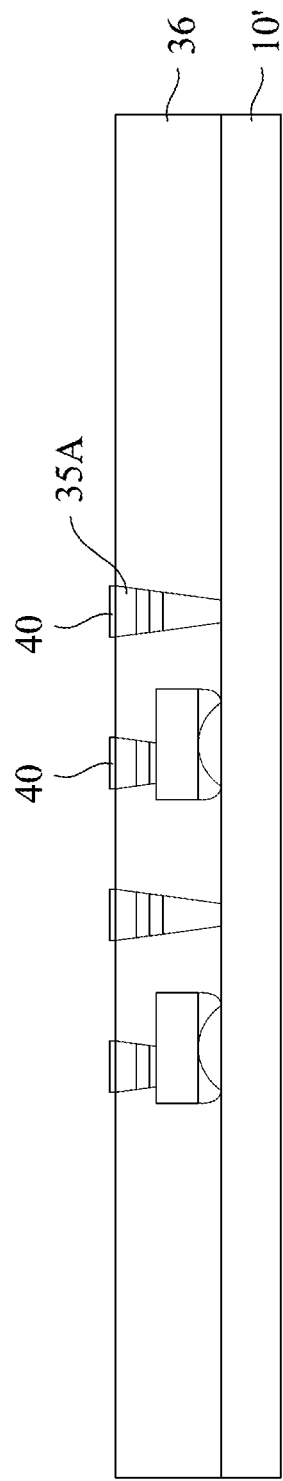

Followed by step S218 and referring to FIG. 9, after forming the upper sealing layer 36, if the metal layers 35B of the masks 35 are removed and then a plurality of metal pads 40 are formed on the exposed copper layers 35A. In some embodiments, metal pads are formed by using plating process, electroless plating process, chemical vapor deposition (CVD) processes, physical vapor deposition (PVD) process, printing process, or other applicable process. In some embodiments, the metal pads are made of solderable materials. In some embodiments, the metal pads include a nickel layer and a gold layer on the nickel layer.

Figure 10:
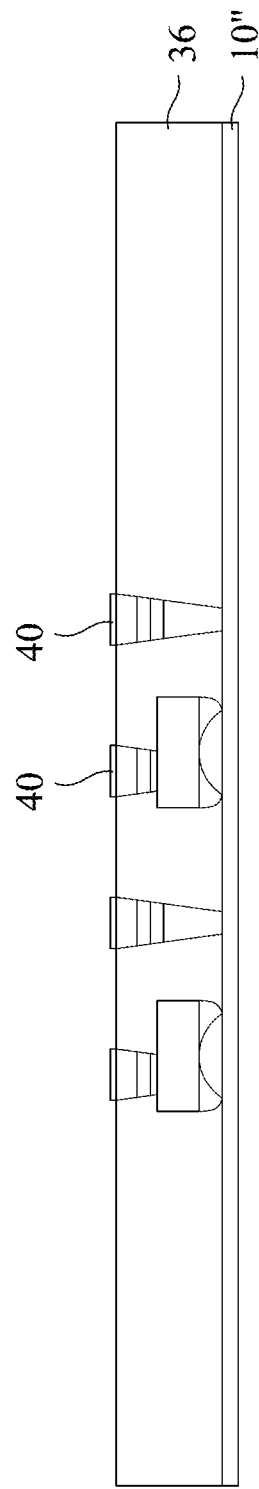

Referring FIG. 10, the bottom substrate 10' is thinned to form a thinned bottom layer 10" after forming the metal pads 40. The thinning process includes grinding process, chemical mechanical polish, or other suitable processes.

Figure 11:
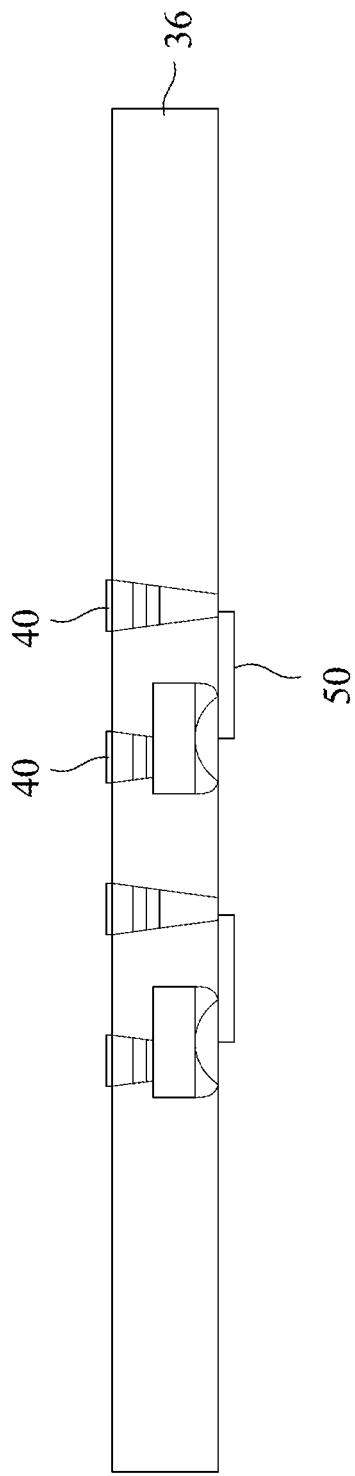

Referring to step S220 and FIG. 11, the thinned bottom layer 10" is patterned to form wiring layer 50. For example, the wiring layer 50 is formed with patterns by using a photolithography and etching process. In some embodiments, the line width of the wiring layer 50 is about 50% to about 100% of the lengths or widths of the die.

Figure 12:
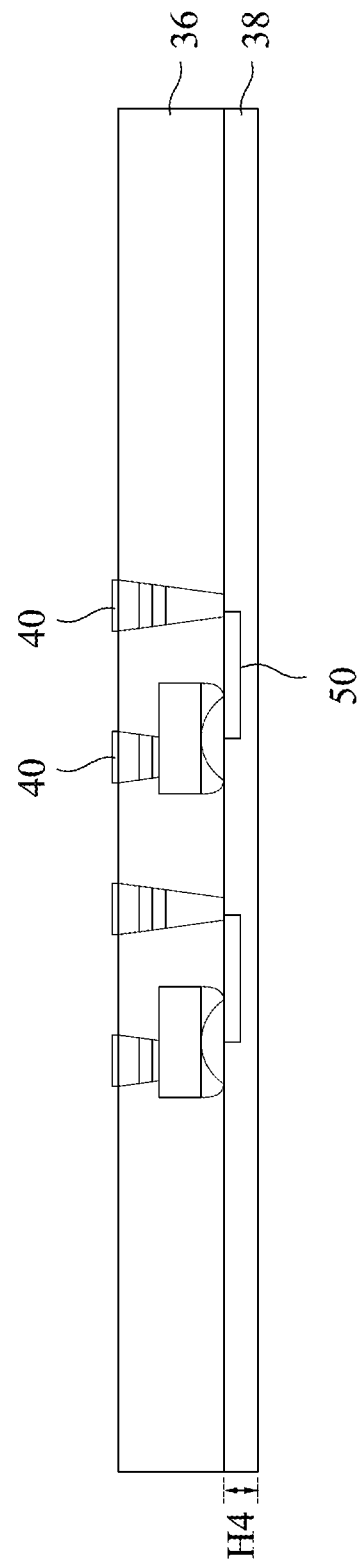

Followed by step S222 and referring to FIG. 12, after forming the wiring layer 50, a lower sealing layer 38 is formed covering the wiring layer 50 to provide protections. In some embodiments, the lower sealing layer 38 is made of epoxy-based resin. In some embodiments, the formation of the lower sealing layer 38 includes injecting process, spin coating process, dispensing process, film lamination process, coating process, or the combinations of thereof. In some embodiments, thermal curing processes are applied in the formation of lower sealing layer 38.

Referring to FIG. 12, after forming the lower sealing layer 38, optionally a thinning process is performed to the lower sealing layer 38. In such, the overall thickness of the package structure can be controlled in predetermined range. The thinning process includes grinding process, chemical mechanical polish, one or more of applicable processes, or the combinations of thereof.

Figure 13:
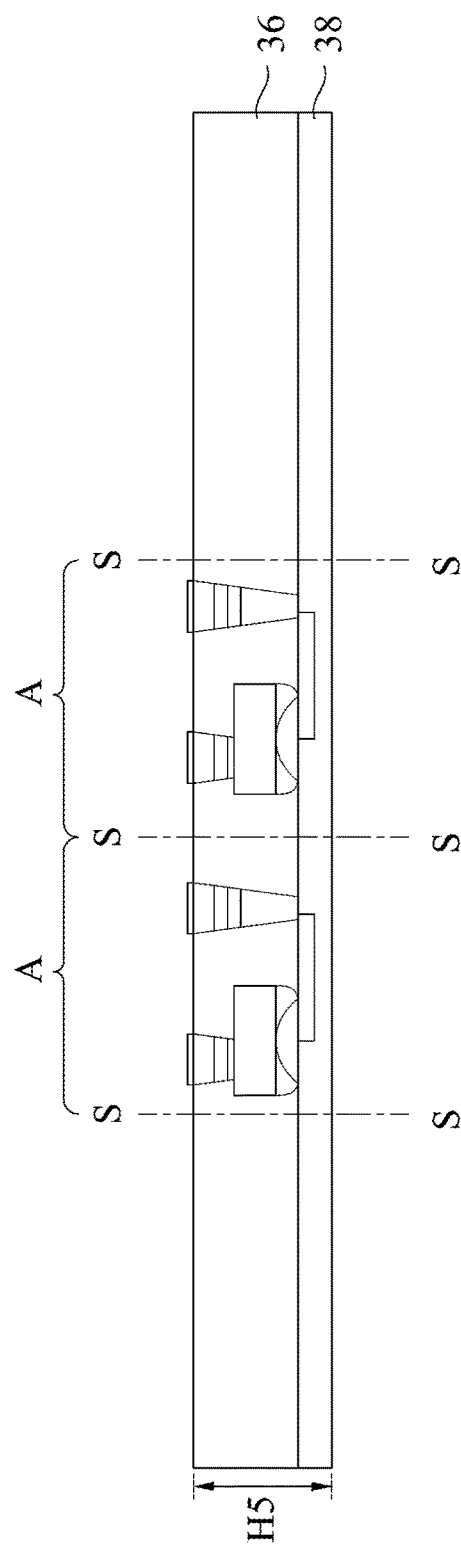
Figure 14:
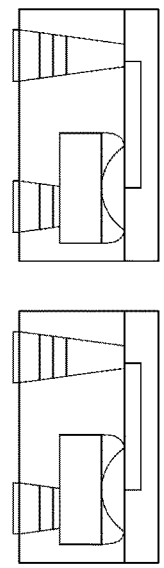

Followed by step S224, a singulation process is performed. The upper sealing layer 36 and the lower sealing layer 38 are cut along with cutting paths S (with respect to the edges of area A) as shown in FIG. 13, a plurality of package structures 300 separated from each other are obtained as shown in FIG. 14. In some embodiments, a thickness H5 of the package structure is ranged from about 130 μm to about 200 μm. H5 is not limited to the range mentioned above and it can be adjusted according to requirements of products.

In various examples, the die package can be used to assembly a light sensing element or a light emitting element. However, the applications are not limited to these. In examples, it can be applied to various electronic components including integrated circuits such as active or passive elements, digital circuits or analog circuits. For example, the physical sense of opto electronic devices, microelectromechanical systems (MEMS), micro fluidic systems, or the physical the sensor by using physical changes measured by changes in physical quantities such as heat, light, and pressure. In particular, the wafer scale package (WSP) process can be used for a semiconductor die encapsulation of image sensing elements, light-emitting diodes (LEDs), solar cells, radio frequency components (RF circuits), accelerators, gyroscopes, micro actuators, surface acoustic wave devices, process sensors or ink printer heads.

In summary, the present invention provides the method of manufacturing die package structures. The present invention omitted wire bonding processes in the conventional method, and it simplifies the process of manufacturing die package structure by providing less restricted in the choice of the etching process. Furthermore, the present invention includes a method for manufacturing an embedded die package structure, the miniaturization of the die package structure in the vertical direction and reduction of the heat dissipation effect of the power chip can be achieved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing die package structure, comprising:
    providing a conductive substrate with a plurality of trenches;
    disposing a die in each of the trenches;
    forming a conductive layer covering the dies and the conductive substrate;
    forming on the conductive layer a patterned photoresist layer with a plurality of openings exposing a plurality of areas of the conductive layer;
    forming a mask on each of the areas of the conductive layer, wherein each of the masks comprises a copper layer and a metal layer on the copper layer;
    removing the patterned photoresist layer after forming the masks;
    selectively etching the conductive layer and the conductive substrate under thereof by using the masks to a predetermined depth to form a plurality of conductive bumps and a plurality of electrodes, wherein a remaining of the conductive substrate comprising a bottom substrate, and the electrodes located on the bottom substrate and the conductive bumps located on the dies; and
    forming an upper sealing layer covering the bottom substrate and the dies, wherein each of the metal layers of the masks or each of the copper layers of the masks is exposed from the upper sealing layer.

2. The method of claim 1, wherein the conductive substrate is substantially made of copper.

3. The method of claim 1, wherein the conductive substrate has a first thickness and each of the trenches has a depth, the depth is in a range of 45%-55% of the first thickness.

4. The method of claim 1, wherein each of the metal layers comprising a nickel layer and a gold layer on the nickel layer.

5. The method of claim 1, further comprising:
    thinning the bottom substrate to form a thinned bottom substrate after forming the upper sealing layer; and
    patterning the thinned bottom substrate thereby forming a wiring layer.

6. The method of claim 5, further comprising:
    forming a lower sealing layer covering the wiring layer after forming the wiring layer; and
    cutting the upper sealing layer and the lower sealing layer to obtain a plurality of package structures separating from each other.

7. The method of claim 6, wherein a thickness of each the package structures is ranged from about 130 µm to about 200 µm.

8. The method of claim 1, wherein forming the conductive layer comprising:
    forming a copper seed layer by using electroless plating; and
    forming a copper plating layer on the copper seed layer by using electroplating.

9. The method of claim 1, wherein forming the upper sealing layer covering the bottom substrate and the dies comprising:
    forming a sealing material layer covering the bottom substrate, the dies, the masks, the electrodes and the conductive bumps; and
    thinning the sealing material layer thereby exposing each of the metal layers from the thinned sealing material layer.

10. The method of claim 1, wherein forming the upper sealing layer covering the bottom substrate and the dies comprising:
    forming a sealing material layer covering the bottom substrate, the dies, the masks, the electrodes and the conductive bumps;
    thinning the sealing material layer, wherein removing each of the metal layers of the masks and exposing each of the copper layers of the masks from the thinned sealing material layer; and
    forming a metal pad on each of the copper layers.

* * * * *